(12) United States Patent
Chae et al.

(10) Patent No.: US 11,764,414 B2
(45) Date of Patent: Sep. 19, 2023

(54) FORMATION EQUIPMENT FOR THE FORMATION OF CYLINDRICAL SECONDARY BATTERIES WITH POSITIVE AND NEGATIVE ELECTRODES ON TOP

(71) Applicant: WONIKPNE, Gyeonggi-do (KR)

(72) Inventors: SooYong Chae, Gyeonggi-do (KR); YoungYong Kim, Gyeonggi-do (KR)

(73) Assignee: WONIKPNE, Suwon-si (KR)

( * ) Notice: Subject to any disclaimer, the term of this patent is extended or adjusted under 35 U.S.C. 154(b) by 220 days.

(21) Appl. No.: 17/373,951

(22) Filed: Jul. 13, 2021

(65) Prior Publication Data
US 2022/0231346 A1    Jul. 21, 2022

(30) Foreign Application Priority Data
Jan. 19, 2021    (KR) .................. 10-2021-0007432

(51) Int. Cl.
*H01M 10/42*    (2006.01)
*G01R 31/385*    (2019.01)
(Continued)

(52) U.S. Cl.
CPC ...... *H01M 10/4285* (2013.01); *G01R 31/385* (2019.01); *H01M 10/441* (2013.01); *H02J 7/0047* (2013.01)

(58) Field of Classification Search
CPC ........... H01M 10/4285; H01M 10/441; H01M 4/0447; G01R 31/385; H02J 7/0047
See application file for complete search history.

(56) References Cited

U.S. PATENT DOCUMENTS 11,145,913 B2 * 10/2021 Sato .................. H01M 10/425
2011/0300425 A1 * 12/2011 Seong ................ H01M 50/209
                                                                429/100
2020/0411898 A1    12/2020 Yu et al.

FOREIGN PATENT DOCUMENTS

CN    109638338    4/2019
CN    209544545    10/2019
(Continued)

OTHER PUBLICATIONS

Extended European Search Report issued in Counterpart European Patent Application No. 21185553.1, dated Jan. 4, 2022, 7 pages.
(Continued)

*Primary Examiner* — Lee E Rodak
*Assistant Examiner* — Trung Q Nguyen
(74) *Attorney, Agent, or Firm* — NORTON ROSE FULBRIGHT US LLP

(57) ABSTRACT

A formation apparatus for performing a charging and discharging test of a cylindrical secondary battery is disclosed. The cylindrical secondary battery includes a cylindrical body, and a positive electrode plate disposed on a top face of the body and a negative electrode plate disposed on the top face of the body. The formation apparatus includes a battery array tray on which a plurality of cylindrical secondary batteries are seated on and are arranged in a matrix form, a secondary battery contact device disposed above the battery array tray, wherein the secondary battery contact device includes a plurality of charging and discharging channels, a power supply disposed above the secondary battery contact device to supply power for the charging and discharging test to each of the plurality of charging and discharging channels, and a heat-dissipating fan facing toward the power supply to prevent overheating of the power supply.

8 Claims, 7 Drawing Sheets

(51) Int. Cl.
*H02J 7/00* (2006.01)
*H01M 10/44* (2006.01)

(56) References Cited

FOREIGN PATENT DOCUMENTS

| CN | 209545180 | 10/2019 |
|---|---|---|
| CN | 111505508 | 8/2020 |
| KR | 1020170100341 | 9/2017 |
| WO | WO 2020/261214 | 12/2020 |

OTHER PUBLICATIONS

International Search Report and Written Opinion issued in Counterpart PCT Application No. PCT/KR2021/008531 dated Oct. 15, 2021 (machine translation provided).

* cited by examiner

FORMATION EQUIPMENT FOR THE FORMATION OF CYLINDRICAL SECONDARY BATTERIES WITH POSITIVE AND NEGATIVE ELECTRODES ON TOP

CROSS-REFERENCE TO RELATED APPLICATION

This application claims a benefit under 35 U.S.C. § 119(a) of Korean Patent Application No. 10-2021-0007432 filed on Jan. 19, 2021, on the Korean Intellectual Property Office, the entirety of disclosure of which is incorporated herein by reference for all purposes.

FIELD OF THE INVENTION

The present disclosure relates to a formation apparatus, and more particularly, to a formation apparatus for charging and discharging a cylindrical secondary battery in which a positive electrode plate and a negative electrode plate are disposed on a top face of a cylindrical body thereof.

DESCRIPTION OF RELATED ART

In a secondary battery, electric energy is released so that an active material changes and thus electric energy is fed to, that is, charged to the battery, such that the active material may be regenerated. A typical example of the secondary battery is a storage battery. In this connection, the storage battery is composed of positive and negative electrode plates and electrolyte therebetween and generates DC electromotive force via chemical reaction and use the same as power. Examples of the storage battery include a lead-acid battery, an alkali battery, and a lithium battery. Currently, lithium batteries with advantages such as high energy density, light weight, high voltage, no pollution, high output, fast charging, and excellent lifespan are in the spotlight. The lithium battery is classified into a lithium ion battery, a lithium ion polymer battery, and a lithium metal polymer battery.

The secondary batteries may be classified into cylindrical, prismatic, and pouch types according to a shape thereof.

Most of the cylindrical secondary batteries are manufactured in a structure in which a positive electrode plate and a negative electrode plate are respectively disposed on top and bottom faces of a cylindrical body. Accordingly, there is a structural limitation in that terminals connected to the positive electrode plate and the negative electrode plate should be opposite to each other in a device using the cylindrical secondary battery.

In order to solve the structural limitation of the cylindrical secondary battery, a cylindrical secondary battery having a new structure in which a positive electrode plate and a negative electrode plate are positioned on a top face of a cylindrical body is being developed.

Further, the secondary battery is manufactured via a process of activating the battery. In the battery activation stage, the secondary battery is mounted on a charging and discharging device, and charging and discharging are performed under conditions necessary for activation. In this way, a process of performing predetermined charging and discharging using the charging and discharging device to activate the battery is referred to a formation process. A formation apparatus is widely used to perform this formation process.

Therefore, the cylindrical secondary battery in which the positive electrode plate and the negative electrode plate are disposed on the top face of the cylindrical body also goes through the formation process using the formation apparatus.

In order to perform the formation process of the cylindrical secondary battery in which the positive electrode plate and the negative electrode plate are disposed on the top face of the cylindrical body, a plurality of cylindrical secondary batteries are arranged on a tray. In order to apply charging and discharging power to the positive electrode plate and the negative electrode plate as the top face of the cylindrical secondary battery, a power supply and the cylindrical secondary battery should be electrically connected to each other. In this connection, an electrical connection between the power supply and the cylindrical secondary battery is usually made using a cable and a bus bar.

In this connection, it takes a lot of time to construct an electrical connection structure between the power supply and the cylindrical secondary battery using the cable and the busbar. Accordingly, it is not easy to manufacture the formation apparatus. Further, there is a problem that an error in the formation process occurs according to disconnection of the cable.

SUMMARY OF THE INVENTION

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a formation apparatus that has a simple electrical contact structure with a cylindrical secondary battery having a positive electrode plate and a negative electrode plate as a top portion thereof, has a compact structure, and is easily manufactured.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

One aspect of the present disclosure provides a formation apparatus for performing a charging and discharging test of a cylindrical secondary battery, wherein the cylindrical secondary battery includes a cylindrical body, and a positive electrode plate disposed on a top face of the body and a negative electrode plate disposed on the top face of the body, wherein the formation apparatus comprises: a battery array tray on which a plurality of cylindrical secondary batteries are seated on and are arranged in a matrix form, wherein the battery array tray is configured to move up and down; a secondary battery contact device disposed above the battery array tray, wherein the secondary battery contact device includes a plurality of charging and discharging channels, each channel having a plurality of probe pins, wherein when the battery array tray moves up, the plurality of probe pins respectively contact the positive electrode plate and the negative electrode plate of each of the secondary batteries; a power supply disposed above the secondary battery contact device to supply power for the charging and discharging test to each of the plurality of charging and discharging channels; and a heat-dissipating fan facing toward the power supply to prevent overheating of the power supply.

In one implementation, the secondary battery contact device includes: a plurality of secondary battery contact modules for applying power for the charging and discharging test to the batteries and for controlling the charging and discharging operations; and a rack assembly for assembling the secondary battery contact modules with the battery array tray and the power supply such that the secondary battery contact modules are disposed between the battery array tray and the power supply.

In one implementation, the rack assembly includes: a sub-rack coupling plate having a sub-rack coupling slot defined on a lower face thereof and extending in a first direction; and a plurality of sub-racks coupled to the sub-rack coupling plate, wherein each of the plurality of sub-racks receives each of a plurality of the secondary battery contact modules, wherein each of the plurality of sub-racks include a coupler defining a top portion of each sub-rack and extending in the first direction and slidingly inserted into the sub-rack coupling slot.

In one implementation, each sub-rack includes: a first sub-rack frame having a predefined vertical dimension; a second sub-rack frame having the same vertical dimension as the vertical dimension of the first sub-rack frame and spaced apart from the first sub-rack frame by a predetermined distance; and the coupler including: an assembling plate a having both opposing distal ends respectively connected to a top of the first sub-rack frame and a top of the second sub-rack frame; and a coupling portion having a vertical portion vertically extending from the assembling plate a and both horizontal extensions respectively extending horizontally from both opposing sides of the vertical portion, wherein each secondary battery contact module is received in a space defined between the first sub-rack frame and the second sub-rack frame, wherein the coupling portion is fitted into the sub-rack coupling slot.

In one implementation, each secondary battery contact module includes: a charging and discharging control board; a plurality of bus bars and for positive and negative electrodes connected to one face of the charging and discharging control board; a probe fixture board disposed under the plurality of bus bars; a plurality of connection terminals for positive and negative electrodes disposed on the probe fixture board and respectively connected to the bus bars; a plurality of pin sockets and disposed on the probe fixture board and arranged around the plurality of connection terminals, wherein some of the plurality of pin sockets are electrically connected to the connection terminal for the positive electrode while the other thereof are electrically connected to the connection terminal for the negative electrode; and the plurality of probe pins coupled to the plurality of pin sockets and connected to the positive electrode plate and the negative electrode plate of the cylindrical secondary battery.

In one implementation, the charging and discharging control board includes: a main board for outputting a control signal necessary for charging and discharging the cylindrical secondary battery; and a channel board electrically connected to the main board for performing charging and discharging of the cylindrical secondary battery connected to the plurality of probe pins, based on the control signal.

In one implementation, each connection terminal includes a BR terminal.

In one implementation, the plurality of pin sockets and includes: positive electrode pin sockets disposed between the plurality of connection terminals to apply a positive electrode voltage and a positive electrode current to the positive electrode plate of the cylindrical secondary battery; and negative electrode pin sockets disposed around the positive electrode pin sockets for applying a negative electrode voltage and a negative electrode current to the negative electrode plate of the cylindrical secondary battery.

In one implementation, the plurality of the secondary battery contact modules are arranged in one direction to define the plurality of charging and discharging channels, wherein the plurality of charging and discharging channel correspond to a single main board, wherein a plurality of channel boards correspond to the single main board and are electrically connected to the single main board.

The formation apparatus according to one embodiment of the present disclosure has following advantages.

First, the secondary battery contact module may allow an electrical contact structure with the cylindrical secondary battery for application of power for charging and discharging the cylindrical secondary battery to be simplified. Further, due to the secondary battery contact module, a power cable for applying power from the power supply to the cylindrical secondary battery may be omitted. Thus, the structure of the formation apparatus becomes compact, and further, the manufacture of the formation apparatus may be facilitated.

Second, while the sub-rack accommodates the secondary battery contact module of the secondary battery contact device, the secondary battery contact module may be slidably inserted to the sub-rack coupling slot of the sub-rack coupling plate. Thus, the secondary battery contact device may be assembled to and disassembled from the formation apparatus. Thus, the number of secondary battery contact modules may be increased or decreased based on the number of secondary batteries to be subjected to the charging and discharging test. Thus, the number of the charging and discharging channels may be easily controlled based on formation capacity of the formation apparatus.

Effects of the present disclosure are not limited to the above-mentioned effects, and other effects as not mentioned will be clearly understood by those skilled in the art from following descriptions.

DETAILED DESCRIPTIONS

Figure 1:
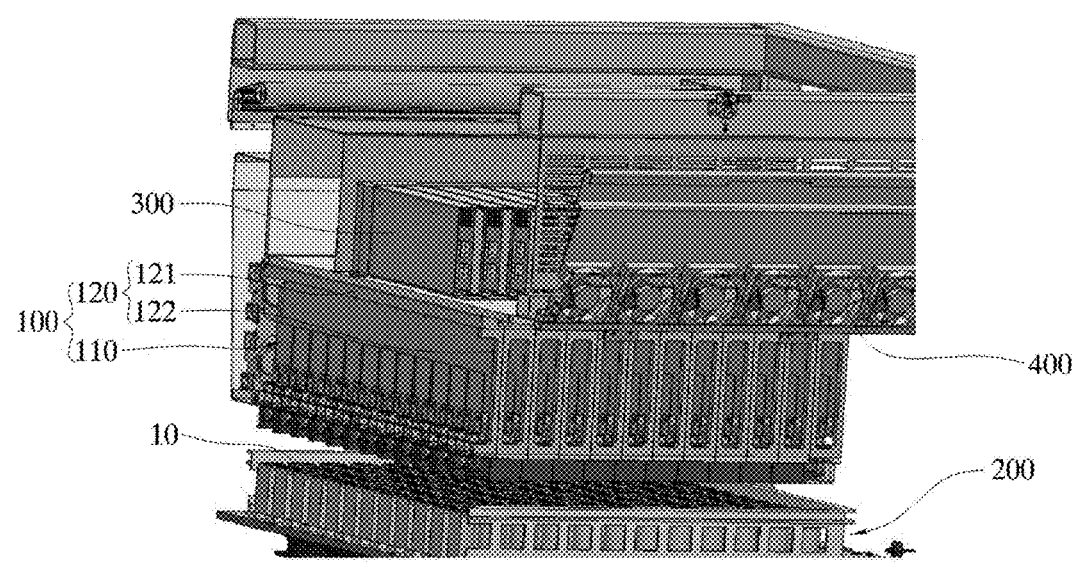
FIG. 1 is a perspective view for illustrating a configuration of a formation apparatus according to one embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "compmoves up", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper,"

and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Figure 2:
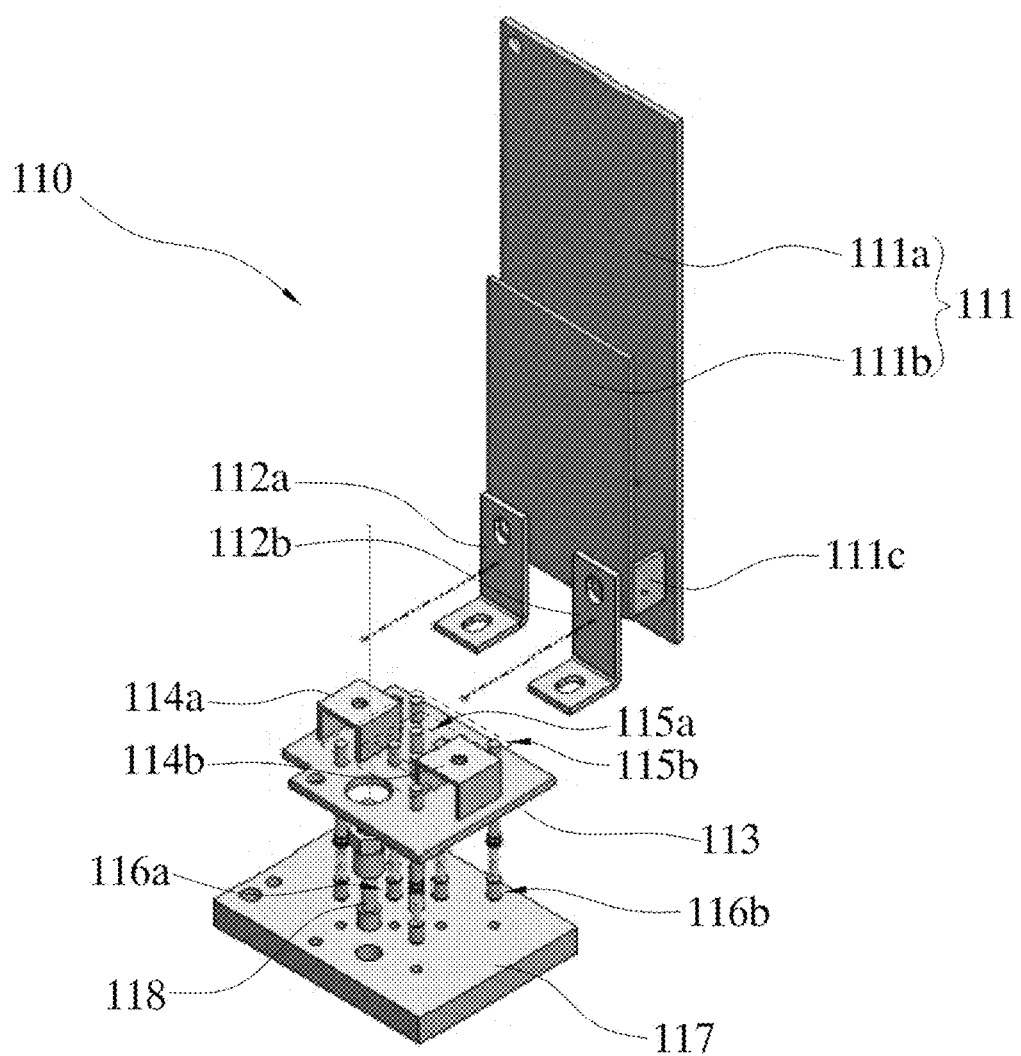
FIG. 2 is a partial exploded perspective view showing a configuration of a secondary battery contact module of a formation apparatus according to one embodiment of the present disclosure.
Figure 3:
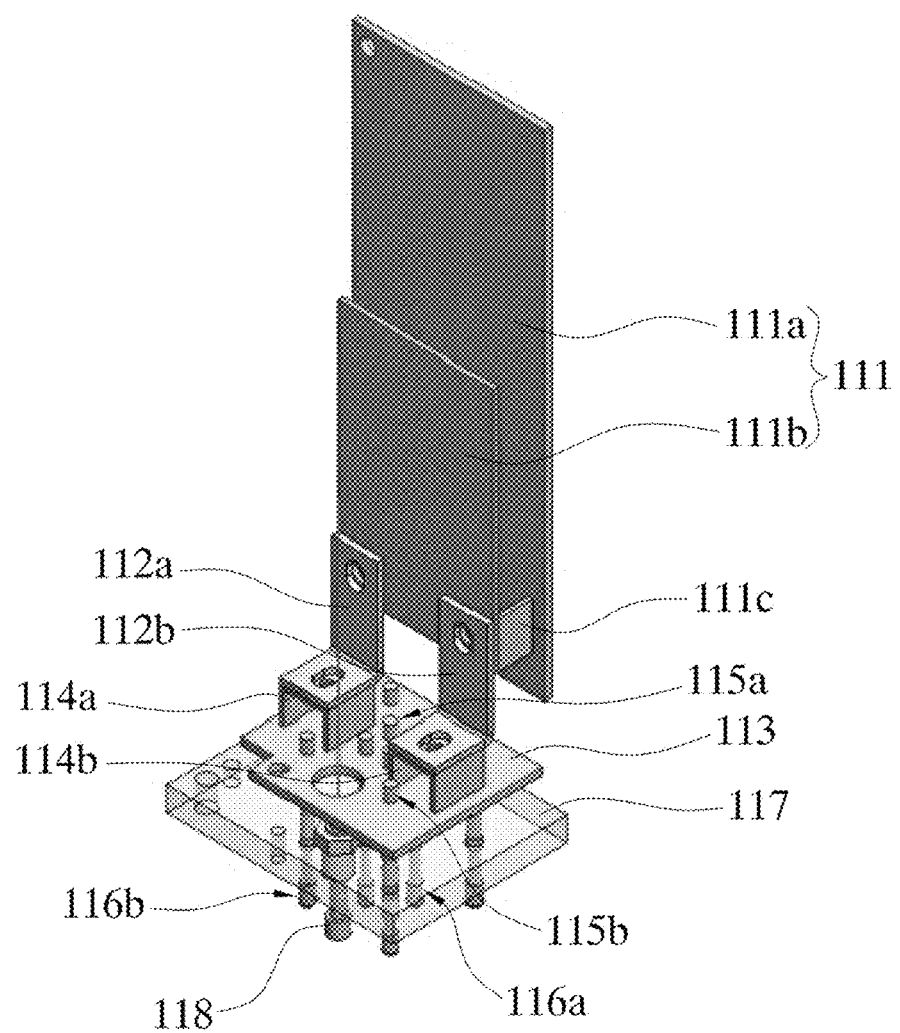
FIG. 3 is a combined perspective view of FIG. 2.
Figure 4:
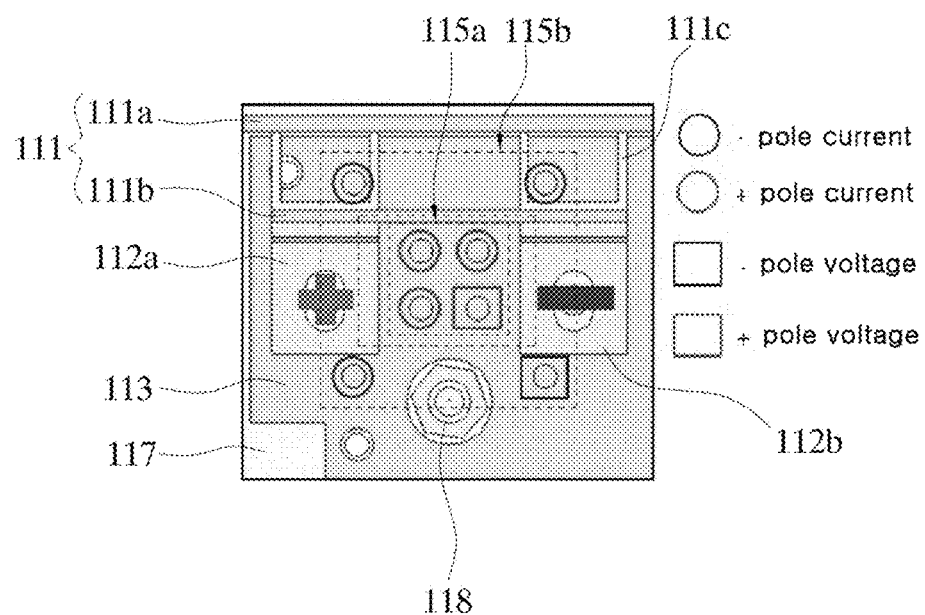
FIG. 4 is a plan view of FIG. 3.
Figure 5:
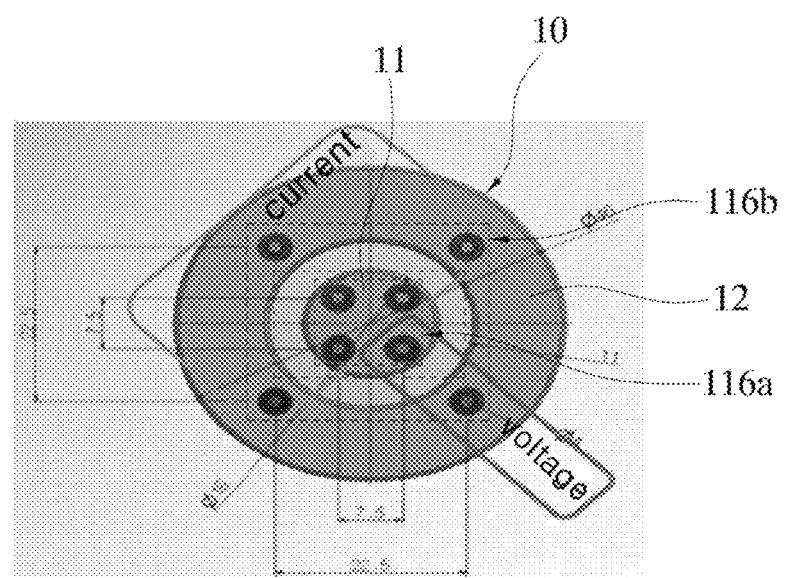
FIG. 5 is a view showing a state in which a plurality of probe pins shown in FIG. 2 and FIG. 3 are in contact with a cylindrical secondary battery.
Figure 6:
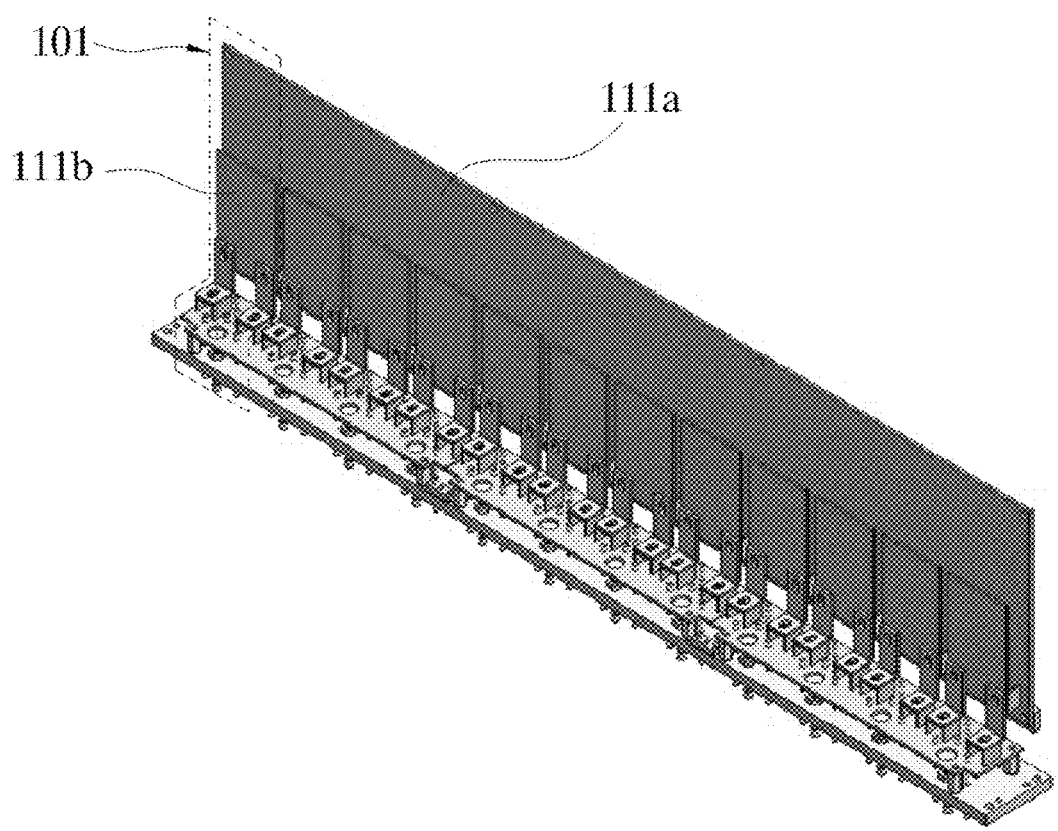
FIG. 6 is a perspective view showing a state in which a plurality of secondary battery contact devices shown in FIG. 2 and FIG. 3 are arranged to form a plurality of charging and discharging channels.
Figure 7:
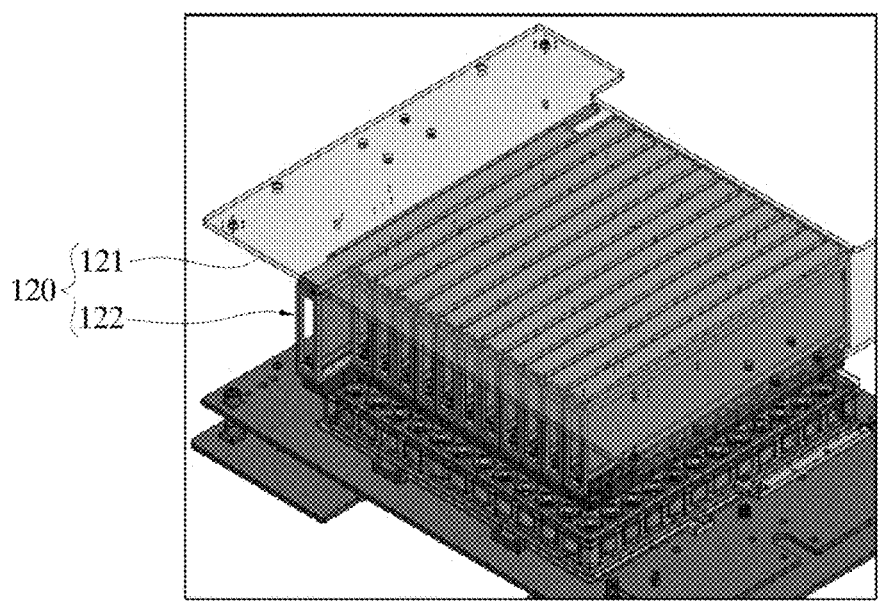
FIG. 7 is a perspective view for illustrating a configuration of a rack assembly for assembling a secondary battery contact module in a formation apparatus according to an embodiment of the present disclosure.
Figure 8:
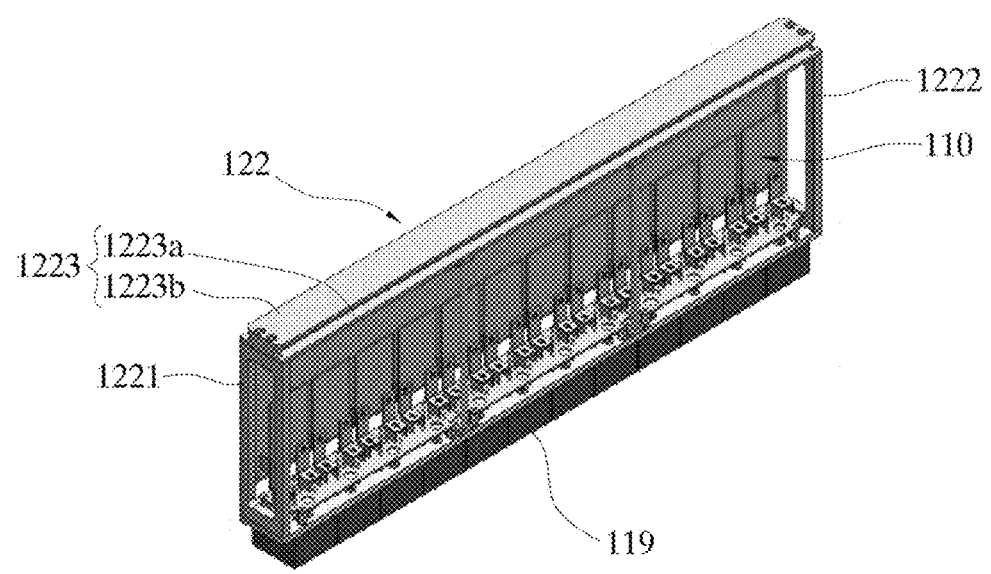
FIG. 8 is an enlarged perspective view of a sub-rack shown in FIG. 7.
Figure 9:
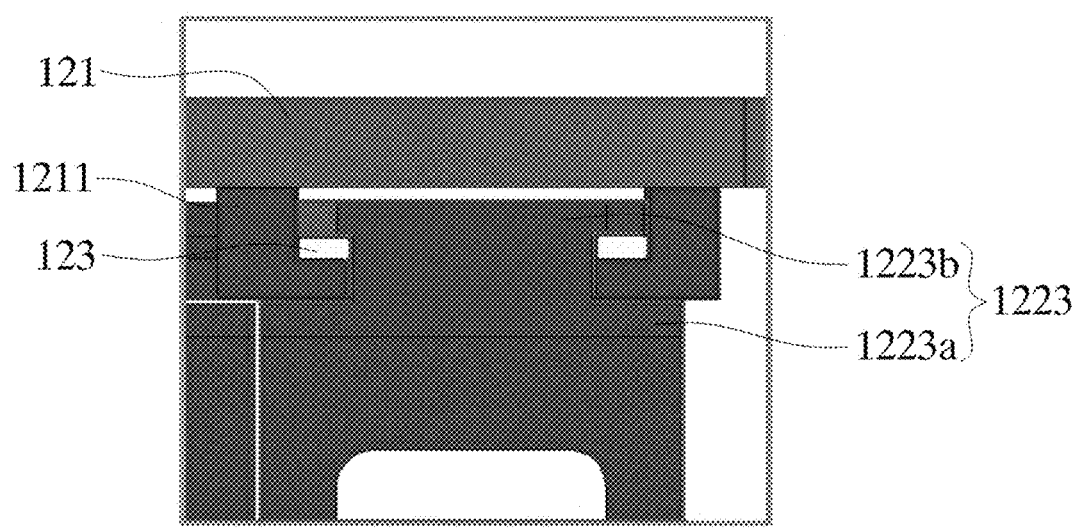
FIG. 9 is a partial enlarged view of a showing a sub-rack coupling slot and a coupler shown in FIG. 7.

FIG. 1 is a perspective view for illustrating a configuration of a formation apparatus according to one embodiment of the present disclosure. FIG. 2 is a partial exploded perspective view showing a configuration of a secondary battery contact module of a formation apparatus according to one embodiment of the present disclosure. FIG. 3 is a combined perspective view of FIG. 2. FIG. 4 is a plan view of FIG. 3. FIG. 5 is a view showing a state in which a plurality of probe pins shown in FIG. 2 and FIG. 3 are in contact with a cylindrical secondary battery. FIG. 6 is a perspective view showing a state in which a plurality of secondary battery contact devices shown in FIG. 2 and FIG. 3 are arranged to form a plurality of charging and discharging channels. FIG. 7 is a perspective view for illustrating a configuration of a rack assembly for assembling a secondary battery contact module in a formation apparatus according to an embodiment of the present disclosure. FIG. 8 is an enlarged perspective view of a sub-rack shown in FIG. 7. FIG. 9 is a partial enlarged view of a showing a sub-rack coupling slot and a coupler shown in FIG. 7.

Referring to FIG. 1, a formation apparatus according to an embodiment of the present disclosure is configured to perform a charging and discharging test of a cylindrical secondary battery in which a positive electrode plate 11 and a negative electrode plate 12 are disposed on a top face of a cylindrical body thereof. The formation apparatus may include a battery array tray 200, a secondary battery contact device 100, a power supply 300 and a heat-dissipating fan 400.

A plurality of cylindrical secondary batteries 10 are arranged in a matrix form and are seated on the battery array tray 200. A vertical level of the battery array tray 200 may be displaceable. For example, the battery array tray 200 may be configured to ascend or descend via a lifting and lowering cylinder device.

The secondary battery contact device 100 may be disposed above the battery array tray 200 and may include a charging and discharging channel 101. The charging and discharging channel 101 includes a plurality of probe pins 116a and 116b. When the battery array tray 200 moves up, the plurality of probe pins 116a and 116b may contact the positive electrode plates 11 and the negative electrode plates 12 of the secondary batteries 10. A specific configuration of the secondary battery contact device 100 will be described later.

The power supply 300 may be disposed above the secondary battery contact device 100 to supply power for the charging and discharging test to each of the plurality of charging and discharging channels 101. In one example, the power supply 300 may be embodied as an inverter power supply having bidirectional flow and conversion functions between AC and DC.

The heat-dissipating fan 400 may face toward the power supply 300, and may discharge high-temperature air around the power supply 300 to prevent overheating of the power supply 300.

In one example, the secondary battery contact device 100 may include a secondary battery contact module 110 and a rack assembly 120 for assembling the secondary battery contact module.

The secondary battery contact module 110 is a component of the formation apparatus for charging and discharging the cylindrical secondary battery 10 in which the positive electrode plate 11 and the negative electrode plate 12 are disposed on the top face of the cylindrical body thereof. Referring to FIG. 2 to FIG. 5, The secondary battery contact module 110 may include a charging and discharging control board 111, a plurality of bus bar 112a and 112b, a probe fixture board 113, a plurality of connection terminals 114a and 114b, a plurality of pin sockets 115a and 115b, and a plurality of probe pins 116a and 116b.

In one example, the charging and discharging control board 111 may control the charging and discharging operations of the cylindrical secondary battery 10 and may include a main board 111a and a channel board 111b.

The main board 111a may output a control signal necessary for charging and discharging the cylindrical secondary battery 10.

The channel board 111b may be electrically connected to the main board 111a and may be configured to include an independent charging and discharging circuit for charging and discharging the cylindrical secondary battery 10 connected to the plurality of probe pins 116a and 116b according to a control signal. In one example, the channel board 111b may be connected to the main board 111a via a connection terminal 111c, and the connection terminal 111c may be a BR terminal.

The plurality of bus bars 112a and 112b may be connected to one face of the charging and discharging control board 111, that is, one face of the channel board 111b, and may include a bus bar 112a for a positive electrode and a bus bar 112b for a negative electrode.

In this connection, an arrangement structure of the plurality of bus bars 112a and 112b and the charging and discharging control board 111 may be constructed such that each of the main board 111a and the channel board 111b extends vertically, and a vertical face of each of the bus bar 112a and 112b is electrically connected to the channel board 111b.

The probe fixture board 113 may be disposed under the plurality of bus bars 112a and 112b, and may extend in a perpendicular manner to the charging and discharging control board 111. The probe fixture board 113 may used for an arrangement of the plurality of pin sockets 115a and 115b and the plurality of probe pins 116a and 116b and for electrical connection between the plurality of pin sockets 115a and 115b and the plurality of probe pins 116a and 116b and the charging and discharging control board 111.

The plurality of connection terminals 114a and 114b are disposed on the probe fixture board 113 and electrically connected to the probe fixture board 113. The plurality of connection terminals 114a and 114b may include a positive electrode connection terminal 114a and a negative electrode connection terminal 114b respectively connected to the bus bars 112a and 112b. In one example, each of the plurality of connection terminals 114a and 114b may be embodied as a BR terminal.

The plurality of pin sockets 115a and 115b may be disposed on the probe fixture board 113 and around the plurality of connection terminals 114a and 114b. Some of the plurality of pin sockets 115a and 115b may be electrically connected to the connection terminal 114a for the positive electrode and the other thereof may be electrically connected to the connection terminal 114b for the negative electrode.

The plurality of pin sockets 115a and 115b may include positive electrode pin sockets 115a and negative electrode pin sockets 115b. In one example, each of the number of the positive electrode pin sockets 115a and the number of the negative electrode pin sockets 115b may be four.

The positive electrode pin sockets 115a may be disposed between the plurality of connection terminals 114a and 114b to apply a positive electrode voltage and a positive electrode current to the positive electrode plate 11 of the cylindrical secondary battery 10. In one example, four positive electrode pin sockets 115a may be provided. In this connection, one positive electrode pin socket 115a may be intended for applying the positive electrode voltage. The three positive electrode pin sockets 115a may be intended for applying the positive electrode current.

The negative electrode pin sockets 115b may be disposed outside the positive electrode pin sockets 115a and may be intended for applying a negative electrode voltage and a negative electrode current to the negative electrode plate 12 of the cylindrical secondary battery 10. In one example, the number of negative electrode pin sockets 115b may be four. In this connection, one negative electrode pin socket 115b may be intended for applying the negative electrode voltage. The three negative electrode pin sockets 115b may be intended for applying the negative electrode current.

The plurality of probe pins 116a and 116b may be coupled to the plurality of pin sockets 115a and 115b, respectively. The plurality of probe pins 116a and 116b may include a probe pin 116a for a positive electrode connected to the positive electrode plate 11 of the cylindrical secondary battery 10, and a probe pin 116b for a negative electrode connected to the negative electrode plate 12 of the cylindrical secondary battery 10.

The probe pin 116a for the positive electrode may be detachably coupled to the positive electrode pin sockets 115a, while the probe pin 116b for the negative electrode may be detachably coupled to the negative electrode pin sockets 115b.

In one example, an electrically-insulating plate 117 may be disposed under the probe fixture board 113. The plurality of pin sockets 115a and 115b may extend through the electrically-insulating plate 117, such that a distal end thereof may protrude downwards beyond the electrically-insulating plate 117. The distal ends of the plurality of probe pins 116a and 116b coupled to the plurality of pin sockets 115a and 115b may be disposed under the electrically-insulating plate 117.

Further, a temperature sensor 118 may be disposed on the probe fixture board 113. The temperature sensor 118 may be electrically connected to the charging and discharging control board 111 via an electrical connection structure between the probe fixture board 113, the connection terminals 114a and 114b, and the bus bars 112a, 112b.

The secondary battery contact module 110 having such a configuration may include a plurality of secondary battery contact modules 110 which may be arranged in one direction as shown in FIG. 6 such that a plurality of charging and discharging channels 101 may be arranged. In this case, there may be one main board 111a, and a plurality of the channel boards 111b may be arranged on one main board 111a and may be electrically connected to one main board 111a.

The secondary battery contact modules 110 respectively defining the plurality of charging and discharging channels 101 may respectively contact the cylindrical secondary batteries 10 arranged on the battery array tray 200 in a corresponding manner to the charging and discharging channels 101. Thus, the secondary battery contact modules 110 may apply the power for charging and discharging operations applied via the charging and discharging control board 111 to the cylindrical secondary batteries 10, respectively.

In one example, referring to FIG. 7 and FIG. 9, the rack assembly 120 for assembling the secondary battery contact module may include a sub-rack coupling plate 121 and a sub-rack 122.

The sub-rack coupling plate 121 may be provided in a rectangular plate shape, and may include a sub-rack coupling slot 1211 extending in one direction and defined in a bottom face thereof.

The sub-rack coupling slot 1211 may include one sub-rack coupling slot or a plurality of sub-rack coupling slots 1211 which may be arranged in a direction perpendicular to a length direction of the sub-rack coupling slot 1211.

The sub-rack coupling slot 1211 may be defined between two L-shaped frames which may be are symmetrical with each other and may be spaced apart from each other by a predetermined distance.

The sub-rack 122 has a plurality of charging and discharging channels and accommodates the secondary battery contact module 110 that is in contact with a plurality of cylindrical secondary batteries 10. The sub-rack 122 may include a coupler 1223 which may define a top face of the sub-rack and extend along a length direction and may be slidingly inserted into the sub-rack coupling slot 1211.

In one example, the sub-rack 122 may include a first sub-rack frame 1221, a second sub-rack frame 1222, and the coupler 1223.

The first sub-rack frame 1221 and the second sub-rack frame 1222 may have a predetermined height and may be arranged to be spaced apart from each other by a predetermined distance.

The coupler 1223 has an assembling plate 1223a having both opposing distal ends respectively connected to tops of the first sub-rack frame 1221 and the second sub-rack frame 1222, and a coupling portion 1223b protruding from a top face of the assembling plate 1223a in a T-shape. Both opposing sides of the T-shaped portion of the coupling portion 1223b may be slidingly coupled to the opposite L-shaped frames defining the sub-rack coupling slot 1211.

That is, the coupling portion 1223b has a vertical portion vertically extending from the assembling plate 1223a and both horizontal extensions respectively extending horizontally from both opposing sides of the vertical portion.

Each secondary battery contact module 110 is received in a space defined between the first sub-rack frame 1221 and the second sub-rack frame 1222. The coupling portion 1223b is fitted into the sub-rack coupling slot 1211. That is, both horizontal extensions of the coupling portion 1223b may be slidably received in the sub-rack coupling slot 1211 while both horizontal extensions respectively slidably contact both L-shaped frames defining the sub-rack coupling slot 1211.

The plurality of sub-racks 122 may be provided such that the plurality of the sub-rack coupling slots 1211 may be arranged. Thus, each secondary battery contact module 110 may be received in each sub-rack coupling slot 1211.

The rack assembly 120 for assembling the secondary battery contact device accommodates therein the secondary battery contact modules 110 of the formation apparatus. Thus, electrical connection between the secondary battery contact modules 110 and the power supply 300 that supplies power to the secondary battery contact module 110, and the assembly of the secondary battery contact modules 110 may be facilitated.

That is, the coupler 1223 of the sub-rack 122 may be slidably inserted into the sub-rack coupling slot 1211 of the sub-rack coupling plate 121. Thus, the secondary battery contact module 110 accommodated in the sub-rack 122 may be easily assembled to the battery array tray 200 and the power supply 300.

In one example, an acetal resin 123 may be disposed between the coupler 1223 of the sub-rack 122 and the sub-rack coupling slot 1211. The acetal resin 123 allows the coupler 1223 of the sub-rack 122 to slide easily in the slot 1211.

In one example, the secondary battery contact device 100 may include a cover 119 for protecting the plurality of probe pins 116a and 116b of the secondary battery contact module 110.

The cover 119 may have a form of a square box with an open top face and an open bottom face thereof, and may be coupled to a bottom face of the electrically-insulating plate 117 of the secondary battery contact module 110 and may surround the plurality of probe pins 116a and 116b.

The plurality of probe pins 116a and 116b may be protected from external impact with the cover 119.

The formation apparatus according to one embodiment of the present disclosure has following advantages.

First, the secondary battery contact module 110 may allow an electrical contact structure with the cylindrical secondary battery 10 for application of power for charging and discharging the cylindrical secondary battery 10 to be simplified. Further, due to the secondary battery contact module 110, a power cable for applying power from the power supply 300 to the cylindrical secondary battery 10 may be omitted. Thus, the structure of the formation apparatus becomes compact, and further, the manufacture of the formation apparatus may be facilitated.

Second, while the sub-rack 122 accommodates the secondary battery contact module 110 of the secondary battery contact device 100, the secondary battery contact module may be slidably inserted to the sub-rack coupling slot 1211 of the sub-rack coupling plate 121. Thus, the secondary battery contact device 110 may be assembled to and disassembled from the formation apparatus. Thus, the number of secondary battery contact modules 110 may be increased or decreased based on the number of secondary batteries to be subjected to the charging and discharging test. Thus, the number of the charging and discharging channels may be easily controlled based on formation capacity of the formation apparatus.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A formation apparatus for performing a charging and discharging test of a cylindrical secondary battery, wherein the cylindrical secondary battery includes a cylindrical body, and a positive electrode plate disposed on a top face of the body and a negative electrode plate disposed on the top face of the body,
wherein the formation apparatus comprises:
a battery array tray on which a plurality of cylindrical secondary batteries are seated on and are arranged in a matrix form, wherein the battery array tray is configured to move up and down;
a secondary battery contact device disposed above the battery array tray, wherein the secondary battery contact device includes a plurality of charging and discharging channels, each channel having a plurality of probe pins, wherein when the battery array tray moves up, the plurality of probe pins respectively contact the positive electrode plate and the negative electrode plate of each of the secondary batteries;
a power supply disposed above the secondary battery contact device to supply power for the charging and discharging test to each of the plurality of charging and discharging channels; and
a heat-dissipating fan facing toward the power supply to prevent overheating of the power supply,
wherein the secondary battery contact device includes a plurality of secondary battery contact modules for applying power for the charging and discharging test to the batteries and for controlling the charging and discharging operations, wherein each secondary battery contact module includes:
a charging and discharging control board;
a plurality of bus bars for positive and negative electrodes connected to one face of the charging and discharging control board;
a probe fixture board disposed under the plurality of bus bars;
a plurality of connection terminals for positive and negative electrodes disposed on the probe fixture board and respectively connected to the bus bars;
a plurality of pin sockets disposed on the probe fixture board and arranged around the plurality of connection terminals, wherein some of the plurality of pin sockets are electrically connected to the connection terminal for the positive electrode while the other thereof are electrically connected to the connection terminal for the negative electrode; and
the plurality of probe pins coupled to the plurality of pin sockets and connected to the positive electrode plate and the negative electrode plate of the cylindrical secondary battery.

2. The apparatus of claim 1, wherein the secondary battery contact device further includes:
a rack assembly for assembling the secondary battery contact modules with the battery array tray and the power supply such that the secondary battery contact modules are disposed between the battery array tray and the power supply.

3. The apparatus of claim 1, wherein the rack assembly 120 includes:

a sub-rack coupling plate having a sub-rack coupling slot defined on a lower face thereof and extending in a first direction; and a plurality of sub-racks coupled to the sub-rack coupling plate, wherein each of the plurality of sub-racks receives each of a plurality of the secondary battery contact modules, wherein each of the plurality of sub-racks include a coupler defining a top portion of each sub-rack and extending in the first direction and slidingly inserted into the sub-rack coupling slot.

4. The apparatus of claim 3, wherein each sub-rack includes:

a first sub-rack frame having a predefined vertical dimension;

a second sub-rack frame having the same vertical dimension as the vertical dimension of the first sub-rack frame and spaced apart from the first sub-rack frame by a predetermined distance; and the coupler including:

an assembling plate having both opposing distal ends respectively connected to a top of the first sub-rack frame and a top of the second sub-rack frame; and a coupling portion having a vertical portion vertically extending from the assembling plate and both horizontal extensions respectively extending horizontally from both opposing sides of the vertical portion, wherein each secondary battery contact module is received in a space defined between the first sub-rack frame and the second sub-rack frame, wherein the coupling portion is fitted into the sub-rack coupling slot.

5. The apparatus of claim 1, wherein the charging and discharging control board includes:

a main board for outputting a control signal necessary for charging and discharging the cylindrical secondary battery; and a channel board electrically connected to the main board for performing charging and discharging of the cylindrical secondary battery connected to the plurality of probe pins, based on the control signal.

6. The apparatus of claim 5, wherein the plurality of the secondary battery contact modules are arranged in one direction to define the plurality of charging and discharging channels, wherein the plurality of charging and discharging channel correspond to a single main board, wherein a plurality of channel boards correspond to the single main board and are electrically connected to the single main board.

7. The apparatus of claim 1, wherein each connection terminal includes a BR terminal.

8. The apparatus of claim 1, wherein the plurality of pin sockets includes:

positive electrode pin sockets disposed between the plurality of connection terminals to apply a positive electrode voltage and a positive electrode current to the positive electrode plate of the cylindrical secondary battery; and negative electrode pin sockets disposed around the positive electrode pin sockets for applying a negative electrode voltage and a negative electrode current to the negative electrode plate of the cylindrical secondary battery.

* * * * *